(12) United States Patent
Graber

(10) Patent No.: US 7,795,918 B2
(45) Date of Patent: Sep. 14, 2010

(54) ADJUSTING OUTPUT BUFFER TIMING BASED ON DRIVE STRENGTH

(75) Inventor: Joel J. Graber, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 75 days.

(21) Appl. No.: 11/839,872

(22) Filed: Aug. 16, 2007

(65) Prior Publication Data

US 2009/0045845 A1   Feb. 19, 2009

(51) Int. Cl.
    *H03K 19/094* (2006.01)
(52) U.S. Cl. .......................... 326/86; 327/108
(58) Field of Classification Search .............. 326/30, 326/68–89; 327/108–112
    See application file for complete search history.

(56) References Cited

U.S. PATENT DOCUMENTS

| | | | | |
|---|---|---|---|---|
| 4,972,101 A | * | 11/1990 | Partovi et al. | 326/86 |
| 6,307,424 B1 | * | 10/2001 | Lee | 327/530 |
| 6,549,036 B1 | * | 4/2003 | Lee | 326/83 |
| 6,756,810 B2 | * | 6/2004 | Mughal et al. | 326/30 |
| 6,836,170 B2 | * | 12/2004 | Kitagawa et al. | 327/308 |
| 7,466,156 B2 | * | 12/2008 | Marsh et al. | 324/763 |
| 7,479,800 B1 | * | 1/2009 | Vullaganti et al. | 326/30 |
| 7,489,159 B2 | * | 2/2009 | Kim | 326/30 |
| 2006/0066346 A1 | * | 3/2006 | Tat Lim et al. | 326/30 |
| 2007/0126466 A1 | * | 6/2007 | Kim | 326/30 |
| 2007/0200591 A1 | * | 8/2007 | Kim | 326/30 |
| 2008/0001623 A1 | * | 1/2008 | Kim | 326/30 |
| 2008/0048714 A1 | * | 2/2008 | Lee et al. | 326/30 |

* cited by examiner

*Primary Examiner*—Vibol Tan
*Assistant Examiner*—Crystal L Hammond
(74) *Attorney, Agent, or Firm*—Robert D. Marshall, Jr.; W. James Brady; Frederick J. Telecky, Jr.

(57) ABSTRACT

This invention operates to select a drive code for an adjustable drive strength transistor in a drive buffer. The drive code is determined employing a scaled-down drive transistor employing varying drive codes compared with a standard. The thus determined drive code is combined with an offset to generate the drive code for the adjustable strength transistor.

7 Claims, 3 Drawing Sheets

US 7,795,918 B2

ADJUSTING OUTPUT BUFFER TIMING BASED ON DRIVE STRENGTH

TECHNICAL FIELD OF THE INVENTION

The technical field of this invention is integrated circuit output buffers.

BACKGROUND OF THE INVENTION

Performance specifications high-speed digital devices assure their proper interface with other devices. One of the most common specifications is the output delay parameter $T_{DOUT}$. This output delay parameter $T_{DOUT}$ is the minimum to maximum delay on the sending device from the clock input to an internal register to the arrival of output data at the sending device pin. To permit tight control of the synchronization between the clock signals on two interfacing integrated circuit chips, the clock for the second chip is often derived directly from the clock of the first chip.

The receiving device often has corresponding specifications requiring that the input data arrive between specified limits of setup time $T_{SETUP}$ and hold time $T_{HOLD}$. This assures that the clock of the receiving device will register the desired data.

FIG. 1 illustrates an example of the output delay and input setup and hold time paths for a common scenario. Output 115 of chip A has the propagation delay time $T_{PD}$ from system clock input 109 to output 115. This propagation delay time $T_{PD}$ includes: the delay in input clock buffer 110; the delay in register element 102; and the delay in output buffer gate 103. Clock 118 for chip B is derived directly from clock 109 of chip A via buffers 106 and 108.

The combination of output delay $T_{DOUT}$ 114 of chip A and the limits between setup time $T_{SETUP}$ 117 and hold time $T_{HOLD}$ 119 of chip B determine whether the interface works properly. Typically the delay of gates 105 and 108 are adjusted to meet the interface specifications. Trimming the delays of gates 105 and 108 result in a match of arrival of data at node 113 and clock node 116 for data capture in register 112. Testing for successful adherence to these specifications places a very severe burden on the test machine for the integrated circuit. This burden gets heavier as the chips operate at increasingly higher clock rates. In addition, chip pin counts are increasing to accommodate wide buses and flexibility through the use of large numbers of control pins. This results in severe test challenges and high test cost.

There is a trend to employ tuning adjustments in the critical parameters to guarantee the AC performance needed at the highest possible yield. These challenges increasingly employ test circuitry on the chip itself. These chips also enable adjustment of the timing to cause a device that would otherwise fail to work properly after the adjustment.

The most successful manner for timing adjustment of the output buffer configuration in current technology adjusts of transistor size in both P-channel and N-channel transistors of the buffer. FIG. 2 illustrates an example prior art circuit employing this basic principle. Binary weighted P-channel transistors 201 are optionally switched into operation according to binary code OVTP 202. Similarly, binary weighted N-channel transistors 203 are optionally switched into operation according to binary code OVTN 204.

Utilizing the adjustments available in FIG. 2 takes many forms. The adjustment could be determined by a totally empirical approach. The output gate performance is evaluated on the chip using a mid-range value of the bit codes, and adjusted to obtain the best results. More sophisticated approaches have been developed using more direct information on the proper code.

It is desirable to develop propagation delay information on a particular chip undergoing adjustments before making arbitrary adjustment choices. Each chip has special properties pertinent to the details of its fabrication process. Normal semiconductor manufacturing results in a distribution of transistor characteristics, yielding transistors of varying drive strengths. Using these transistors results in a distribution of gate delays. Thus adjustment is needed to yield the best performance.

Normally some measurements are made on the output performance on the chip as illustrated in FIG. 1. The key to adjustments for performance improvement lie in making a connection between data taken on a chip to the expected performance of a standard gate also measured on the chip.

SUMMARY OF THE INVENTION

This present invention makes adjustments in the output timing of data buffers and clock buffers in chips using PVT compensated buffers. Hardware intercepts a bit code broadcast to adjust these buffers. This invention makes offset adjustments at the output stages according to measurements made on the output paths. These output offset adjustments are recorded in memory-mapped registers assigned for each section of output stage and then used to precisely set the output timing.

BRIEF DESCRIPTION OF THE DRAWINGS

These and other aspects of this invention are illustrated in the drawings, in which.

DETAILED DESCRIPTION OF PREFERRED EMBODIMENTS

Figure 3:
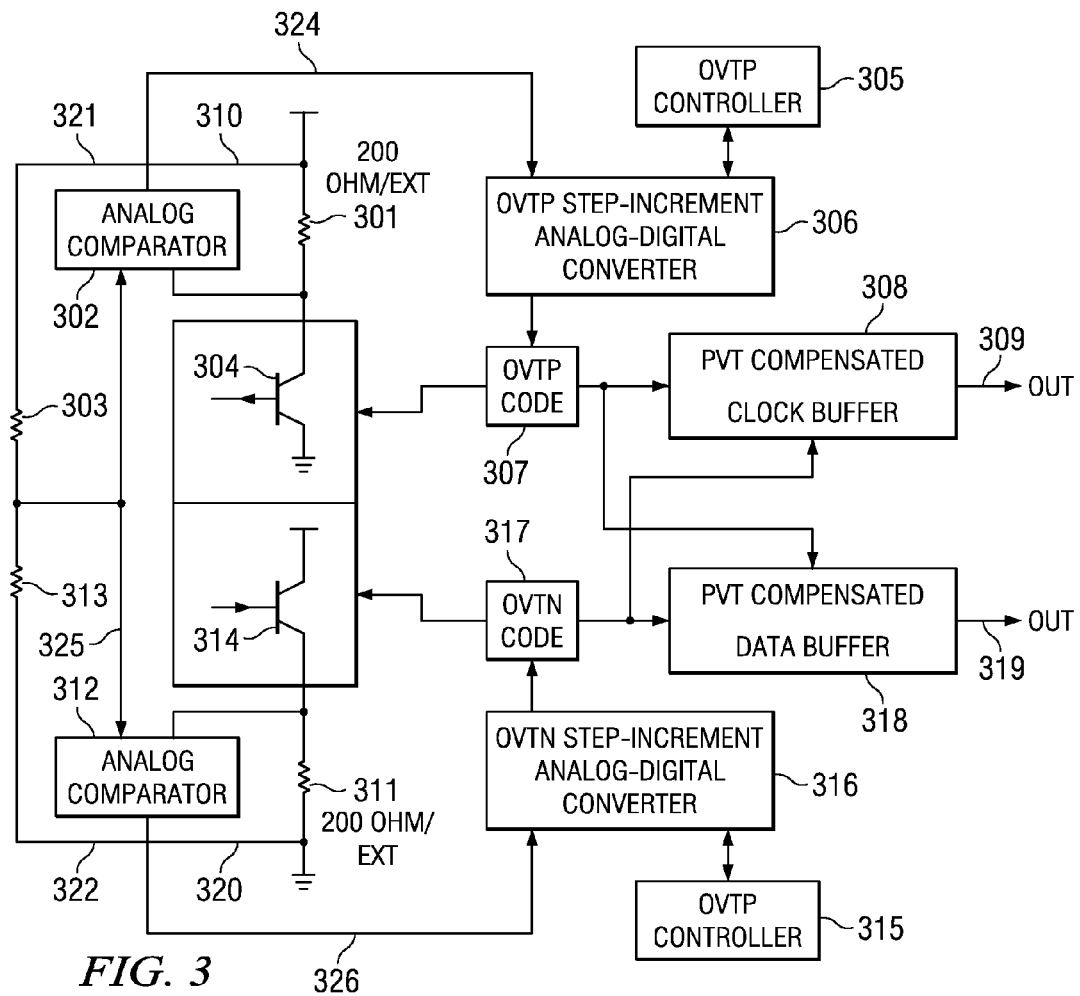
FIG. 3 illustrates a block diagram of the hardware employed to derive the bit codes in PVT compensated buffers.

The conventional procedure for determining the OVTP and OVTN codes uses a calibration cell illustrated in FIG. 3. This cell is used to select a code based on measurements made on test transistors 304 and 314. Output buffers 308 and 318 are designed to drive the current level required by a 50 ohm load. In order to conserve silicon area in the calibration cell, transistors 304 and 314 are scaled down and designed to drive a 200 ohm load. The major elements of the calibration cell are:

Two 200 ohm external resistors 301 and 311 representing one fourth of a normal load for an output stage;

Two analog comparators 302 and 312;

Two equal-value external resistors 303 and 313 connected between VDD supply 310 and ground 320, generating a reference voltage 325 equal to one half VDD for the analog comparator circuits 302 and 312;

Two binary weighted transistors 304 and 314 having a strength one fourth of the transistors 201 and 203 used in the PVT compensated buffers 308 and 318; and There are two controllers: OVTP controller 305 driving step-increment A-D converter 306; and OVTN controller 315 driving step-increment A-D converter 316.

At initialization, the OVTP controller 305 supplies a minimal code value to the code output block 307 and OVTN controller 315 supplies a minimal code value to the code output block 317. This constitutes a first trial for sizing transistors 304 and 314 to drive external resistors 301 and 311. On this first trial, the outputs of analog comparators 302 and 312 will normally produce a low trip signal at respective outputs 324 and 326. This initiates a step upward in the code signals from 307 and 317 for a second trial.

The OVTP step-increment A-D converter 306 drives controller 305 to increment the OVTP and OVTN step-increment A-D converter 316 drives controller 315 to increment the OVTN code. This process continues individually in a single step fashion until the respective analog comparators 302 and 312 reach their trip point.

Once the trip point is reached at node 324 or 326, the corresponding A-D converter 306 or 316 acts independently to freeze the present 5-bit code in the corresponding code output 307 or 317. Codes so determined at 307 and 317 are then applied to the PVT for a standard adjustment to the output buffer transistor sizes. This code is normally stored in a memory mapped register holding the adjust value for a particular set of output buffers.

Figure 4:
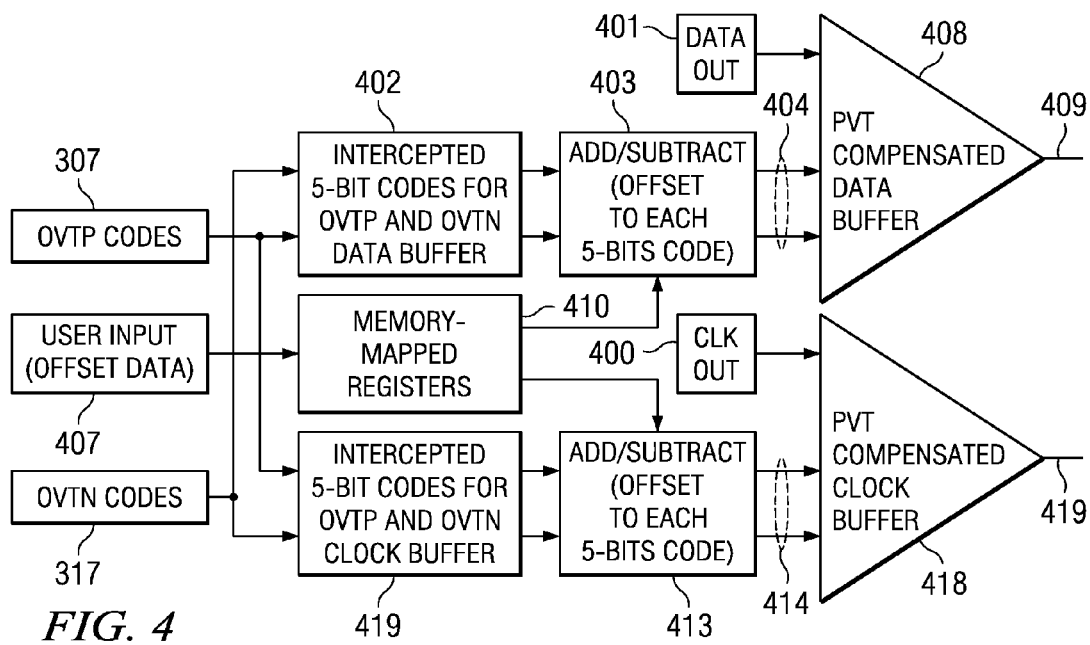
FIG. 4 illustrates the hardware modifications of present invention for making fine tuning offset adjustments to the bit codes derived in FIG. 3.

FIG. 4 illustrates a block diagram of the hardware and the process flow for modifying the bit codes used to make binary adjustments in PVT compensated buffers. After measurements are made on the output buffers of each individual or each bank of buffers, user input offset parameters 407 are developed to adjust the bit codes 402 and 419 generated by the hardware of FIG. 3. Add/subtract units 403 and 413 develop the adjusted codes 404 and 414 based on offset parameters stored in memory-mapped registers 410. The adjusted OVTP/OVTN codes 404 and 414 are applied to the buffer circuits 408 and 418 based on the assumption that the quarter strength buffers give an accurate indication of the amount to tune the output buffer stages to center their performance distribution. The resulting clock to output performance (input 400 to output 419) and data to output performance (input 401 to output 409) are thereby adjusted to conform to both the strength of the transistors on a given chip and actual measurements of the buffer delays before offset adjustment.

Figure 5:
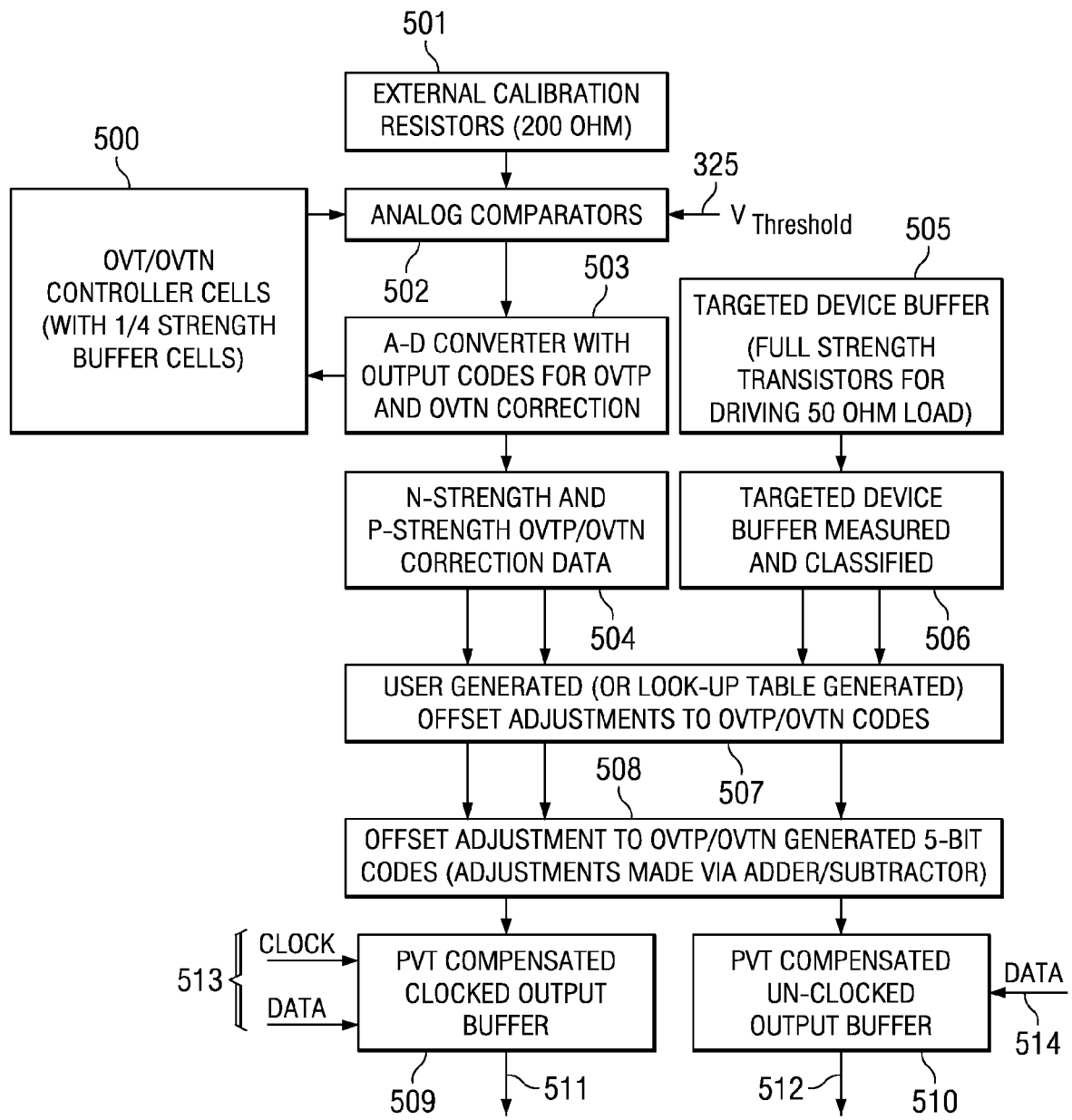
FIG. 5 illustrates a flow diagram of the process for utilizing PVT compensated buffers with offset adjustments made according to the present invention.

FIG. 5 illustrates a flow diagram of the process utilizing the PVT compensated buffers in their standard manner with offset adjustments made according to this invention. Functional block 500 represents a portion of the calibration circuit of FIG. 3. In block 500 the standard transistors sized down by quarter receive a 5-bit code for the P-channel transistors and the N-channel transistors from A-D converters within block 503.

First trial code is normally binary "00001." This causes only the smallest size transistors of both P-channel and N-channel type to be activated. Analog comparators 502 compare the outputs from both the P-channel and the N-channel transistors of buffer cells 500 to the current driven through calibration resistors 501. The trip point for analog comparators 502 are set at mid-point between VDD and VSS by the $V_{Threshold}$ input 325 from FIG. 3. Controller 500 drives the A-D converters 503 to increment step-wise until the trip point is reached on the P-channel cell and the N-channel cell individually. When the respective trip points are reached, the controller freezes the individual P-channel (OVTP) code and N-channel (OVTN) code in block 504.

Figure 1:
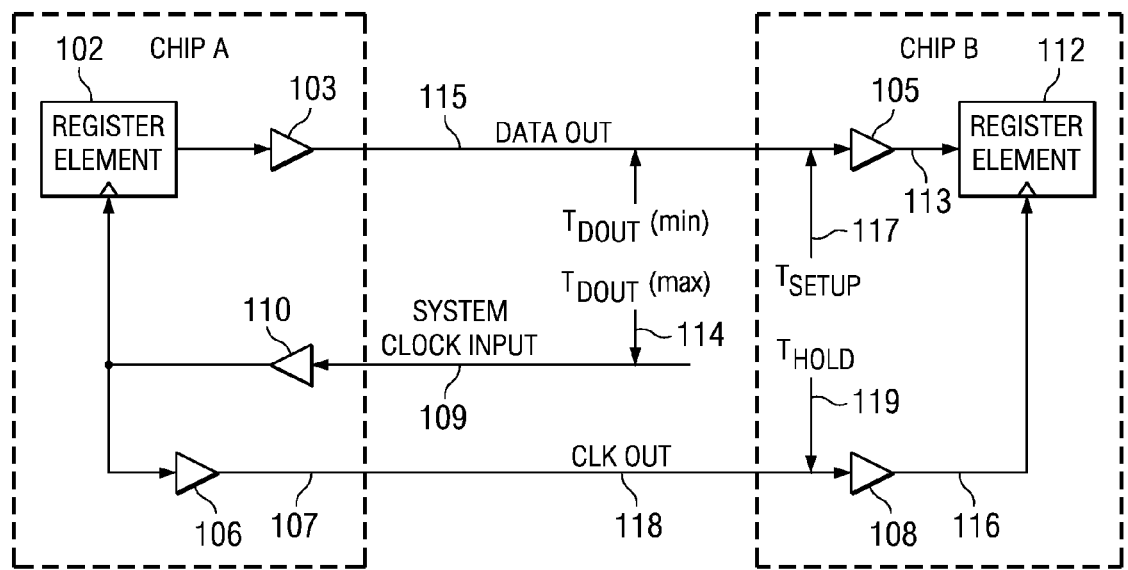
FIG. 1 illustrates a typical set of input and output buffer stages defining critical input and output timing parameters defined (Prior Art)
Figure 2:
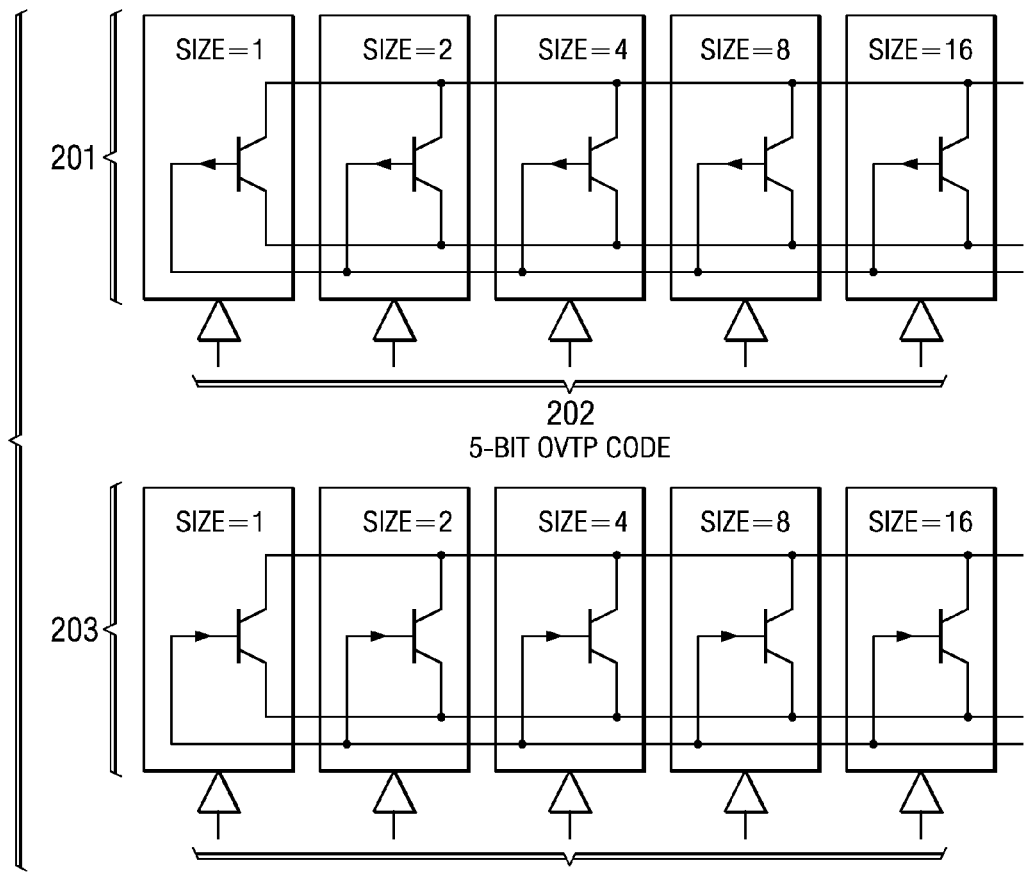
FIG. 2 illustrates an example P-channel and N-channel transistor configuration used in PVT compensated buffer stages (Prior Art)

Block 505 evaluates the targeted device buffer stage to be compensated. Block 506 measurements the parameters illustrated in FIG. 1 and classifies the target buffer. This classification of the targeted buffer performance against the full range of expected performance is used to generate an offset to the OVTP/OVTN codes. Block 507 combines the OVTP/OVTN correction data from block 504 and the classification data from block 506. Block 508 computes the offset-adjusted 5-bit codes to be applied to the PVT compensated clocked output buffer via block 509 and the PVT compensated unclocked output buffer via block 510.

Two methods can be used to generate the required offset adjustments. The classification data generated in block 506 can be used to drive a look-up table converting the OVTP/OVTN codes of block 504 into the offset adjusted codes driving blocks 509 and 510. Alternatively, the user may empirically determine the optimal offset adjustment from repeated measurements of targeted buffer performance and iterative trials of different adjustments.

What is claimed is:

1. A method of setting an adjustable buffer drive strength including the steps of:
    comparing a scaled-down drive transistor having a predetermined relationship to an actual drive transistor to a standard at a plurality of drive strengths;
    selecting one drive strength upon detection of a predetermined relationship between the scaled-down drive transistor at said one drive strength and said standard;
    determining an offset drive strength to said one drive strength;
    combining said one drive strength and said offset drive strength to determine an actual drive strength for the actual drive transistor; and
    setting the drive strength of the actual drive transistor as said determined actual drive strength.

2. The method of claim 1, wherein:
    said step of comparing a scaled-down drive transistor to the standard at a plurality of drive strengths includes
        causing a digital code source to select minimal drive for drive transistor;
        setting a test drive strength to a minimum drive strength,
        comparing a voltage across a reference resistor driven by said scaled-down drive transistor at a current drive strength with a standard voltage,
        if a comparison has a first predetermined result, selecting the current drive strength as said one drive strength; or
        if a comparison has a second predetermined result opposite to the first predetermined result, advancing a the current drive strength to a next sequential drive strength and repeating said comparing until a comparison has a first predetermined result.

3. The method of claim 1, wherein:
    said step of determining an offset drive strength includes receiving a user input specifying the offset drive strength.

4. The method of claim 1, wherein:
    said step of determining an offset drive strength includes classifying the actual drive transistor, and
        recalling an offset drive strength from a look-up table at an entry corresponding to said classification of the actual drive transistor.

5. The method of claim 1, further comprising:
performing said steps of comparing, selecting, determining, combining and setting a first time for a P-channel actual drive transistor; and
performing said steps of comparing, selecting, determining, combining and setting a second time for an N-channel actual drive transistor.

6. A buffer having an adjustable drive strength corresponding to a digital code comprising:
a standard voltage generator;
a comparison voltage generator including a resistor having a predetermined resistance and a scaled-down drive transistor having an adjustable drive strength corresponding to said digital code, said scaled-down transistor having a predetermined relationship to an actual drive transistor;
an analog comparator comparing said standard voltage and said comparison voltage;
a digital code source;
a test controller operable to
    initially cause said digital code source to supply a minimal digital code to said scaled-down drive transistor causing said digital code source to select a minimal drive strength,
    cause said digital code source to supply a next sequential digital code to said scaled-down drive transistor if said analog comparator indicates a first predetermined comparison result, and
    select a current digital code to supply said actual drive transistor in said buffer if said analog comparator indicates a second predetermined comparison result opposite to said first predetermined comparison result; and
an add/subtract unit having a first input receiving said selected current digital code, a second input receiving user input offset data and an output generating a sum of said selected current digital code and said user input offset data controlling the drive strength of the adjustable drive strength buffer.

7. The buffer of claim 6, wherein:
said scaled-down drive transistor consists of a P-channel transistor; and
said buffer further comprising:
    a second scaled-down transistor consisting of an N-channel transistor, said second scaled-down transistor having a predetermined relationship to a second actual drive transistor,
    a second analog comparator comparing said standard voltage and said comparison voltage,
    a second digital code source, and
    a second test controller operable to
        initially cause said second digital code source to supply the minimal digital code to said scaled-down drive transistor causing said second digital code source to select the minimal drive strength,
        cause said second digital code source to supply a next sequential digital code to said second scaled-down drive transistor if said second analog comparator indicates said first predetermined comparison result, and
        select a second current digital code to supply said second actual drive transistor in said buffer if said second analog comparator indicates said second predetermined comparison result; and
    a second add/subtract unit having a first input receiving said second selected current digital code, a second input receiving said user input offset data and an output generating a sum of said second selected current digital code and said user input offset data controlling the drive strength of a second adjustable drive strength buffer.

* * * * *